US007952939B2

(12) United States Patent
Chen et al.

(10) Patent No.: US 7,952,939 B2
(45) Date of Patent: May 31, 2011

(54) CIRCUIT AND METHOD FOR VDD-TRACKING CVDD VOLTAGE SUPPLY

(75) Inventors: Yen-Huei Chen, Hsin-Chu (TW); Wei Min Chan, Sindian (TW); Shao-Yu Chou, Chu-Pei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 306 days.

(21) Appl. No.: 12/205,243

(22) Filed: Sep. 5, 2008

(65) Prior Publication Data

US 2009/0316498 A1    Dec. 24, 2009

Related U.S. Application Data

(60) Provisional application No. 61/074,917, filed on Jun. 23, 2008.

(51) Int. Cl.
*G11C 5/14* (2006.01)
(52) U.S. Cl. ............... 365/189.09; 365/226; 365/203
(58) Field of Classification Search ............. 365/189.09, 365/226, 203, 63, 154, 227, 228, 229, 104, 365/185.26, 205, 185.21, 191, 230.06, 185.14
See application file for complete search history.

(56) References Cited

U.S. PATENT DOCUMENTS

| | | | | |
|---|---|---|---|---|
| 7,433,218 | B1 * | 10/2008 | Urabe | 365/49.1 |
| 2002/0122329 | A1 * | 9/2002 | Ma et al. | 365/154 |
| 2006/0227633 | A1 * | 10/2006 | Lee | 365/200 |
| 2008/0049530 | A1 * | 2/2008 | Hirota et al. | 365/205 |

OTHER PUBLICATIONS

Chen et al. A 0.6V 45nm adaptive dual-rail SRAM compiler circuit design for lower VDD_min VLSIs,in VLSI Circuit, 2008 IEEE, Issue date Jun. 18-20, 2008.*
Chen, Y.H., et al., "A 0.6 V 45nm Adaptive Dual-rail SRAM Compiler Circuit Design for Lower VDD_min VLSIs," VLSI Symposium 2008, IEEE, Jun. 2008, pp. 1-2.
Zhang, K., et al., "A 3-GHz 70-Mb SRAM in 65-nm CMOS Technology with Integrated Column-Based Dynamic Power Supply," IEEE Journal of Solid-State Circuits, Jan. 2006, pp. 146-151, vol. 41, No. 1.
Mair, H., et al., "A 65-nm Mobile Multimedia Applications Processor with an Adaptive Power Management Scheme to Compensate for Variations," 2007 Symposium on VLSI Circuits Digest of Technical Papers, pp. 224-225.

(Continued)

*Primary Examiner* — Dang T Nguyen
(74) *Attorney, Agent, or Firm* — Slater & Matsil, L.L.P.

(57) ABSTRACT

Circuit and methods for providing the CVDD supply to the cells in an SRAM array while maintaining a desired VDD voltage. A circuit is described for tracking the VDD supply voltage and providing a CVDD supply for the SRAM cells that maintains an offset above VDD until a maximum voltage for the CVDD voltage is reached. The CVDD voltage supplies the word line drivers and the cells in an SRAM array, while the bit line precharge and the remaining circuitry is operated on the VDD supply. By maintaining a maximum offset between the voltage CVDD and the supply voltage VDD, the SRAM will have the required static noise margins for reliable operation, while a lowered VDD_min voltage may also be obtained. A method for supplying a CVDD voltage to an SRAM cell array is disclosed where the CVDD voltage tracks a VDD supply voltage plus a predetermined offset voltage.

30 Claims, 9 Drawing Sheets

OTHER PUBLICATIONS

Yabuuchi, M., et al., "A 45 nm Low-Standby-Power Embedded SRAM with Improved Immunity Against Process and Temperature Variations," ISSCC 2007/Session 18/SRAM/18.3, 2007 IEEE International Solid-State Circuits Conference, 3 pages.

Pille, J., et al., "Implementation of the Cell Broadband Engine™ in 65 nm SOI Technology Featuring Dual Power Supply SRAM Arrays Supporting 6 GHz at 1.3 V," IEEE Journal of Solid-State Circuits, Jan. 2008, pp. 163-171, vol. 43, No. 1.

* cited by examiner

CIRCUIT AND METHOD FOR VDD-TRACKING CVDD VOLTAGE SUPPLY

This application claims the benefit of U.S. Provisional Application No. 61/074,917 filed on Jun. 23, 2008, entitled "VDD-Tracking CVDD Dual Rail SRAM Design," which application is hereby incorporated herein by reference.

TECHNICAL FIELD

The present invention relates to circuits and methods for providing improved memory core positive voltage supply (CVDD) regulation to SRAM arrays. SRAM arrays are often embedded in present day integrated circuits with added logic circuitry, macros such as DSPs and processors, analog front end and other circuits. Often, silicon compilers or similar automated design tools are used to specify the SRAM arrays. As semiconductor process technology advances, increasingly circuit compilation tools are used and ideally the SRAM designs created by these tools are reusable and scalable to different processes to enhance performance without redesign. Conventional SRAM arrays and embedded SRAM arrays have a fixed voltage requirement for the CVDD supply voltage, and this parameter also necessarily limits the possible reduction in the VDD supply, placing a fixed limit on the important voltage supply parameter of VDD_minimum (VDD_min). The present invention is directed to providing an improved circuit and methods that effectively provide a power efficient SRAM array that is reusable, scalable, and allows further reduction in VDD_min while providing sufficient static noise margin (SNM) for the SRAM cells.

BACKGROUND

In integrated circuits, power consumption and management of power is increasingly a critical issue. The reduction of power consumption has become and continues to be critically important as more electronic devices are manufactured for battery use, such as portable devices.

Storage is also required in integrated circuits. Many integrated circuits require semi-permanent storage of various data. On-board storage on an integrated circuit is increasingly used. Static RAM or SRAM arrays are often embedded with other logic circuitry, processor, cell phone circuitry, and other functions to provide highly integrated single chip solutions, sometimes referred to as SOICs or "systems on a chip".

Design techniques are often incorporated into the design process of integrated circuits that allow the use of software circuit compilation tools to provide embedded SRAM arrays in particular process technologies. These tools free the human circuit designer from having to repeatedly create common, well known elements. These designs also ideally are reusable in other process technologies, by "shrinking" or process scaling. Scalable and reusable circuit designs allow the integrated circuit maker to achieve fast time to market with new products with minimal rework.

As semiconductor process technologies advance, the minimum feature sizes are being continually reduced. For example, recent advances have provided first 90 nanometer processes, then 65 and 45 nanometers, and now 32 nanometer and 28 nanometer processes are becoming commercialized. As the process shrinks continue, the supply voltage VDD provided to most circuits in the integrated circuit is also reduced. Because using the minimum VDD supply voltage that can be used is desirable to save power and increase efficiency, the parameter VDD_min is an important performance measure for an integrated circuit. As this parameter is reduced, the use of the circuit in battery powered applications is particularly enhanced. Increasingly battery powered portable applications for integrated circuits are of great import, such as for music players, cell phones, mobile web browsers, PDAs, mobile email, laptop, notebook and mobile PCs, GPS units and the like.

However, in conventional SRAM arrays such as those created using SRAM compilers, the voltage supplied to the core array of cells CVDD has requirements that limit the possible reduction in VDD_min. For example, in many conventional SRAM designs the CVDD voltage may be fixed and limited to, for example, about 1.2 Volts. The difference between the voltage supplied to the core array, and that of the VDD supply to the logic circuitry surrounding and in communication with the SRAM cells can cause erroneous operation of the SRAM if it becomes too large. Typically, the maximum offset voltage difference CVDD-VDD must be maintained at around 0.35-0.5 Volts or less. This means VDD_min cannot be reduced too far below CVDD.

Figure 1:
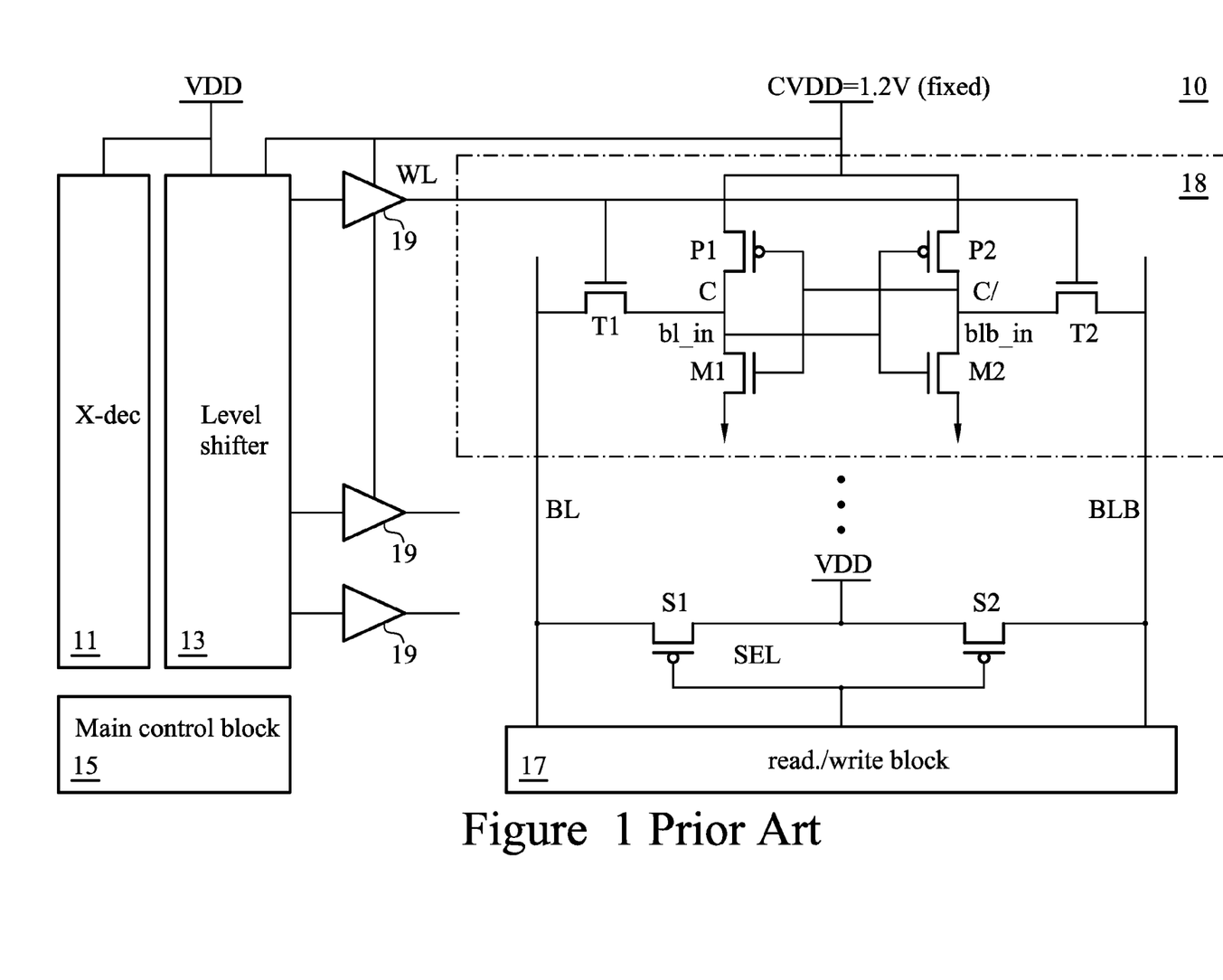
FIG. 1 illustrates in a simplified block diagram a prior art SRAM circuit.

FIG. 1 depicts a prior art SRAM circuit 10 in a simplified block diagram. The SRAM may be a stand alone integrated circuit, and more typically in present day applications, may be a compiled design or a design macro that is embedded memory on an integrated circuit along with other circuitry. The SRAM array is used to provide static data storage for an integrated system.

SRAM arrays are formed of storage cells arranged in rows and columns. Addresses to the SRAM array result in a row line or word line becoming active to select a row of cells, and a pair of column or bit lines is then used to access the cells at the intersection of the active row. In FIG. 1, decoders 11 are used to determine which memory cell row is active for a particular operation. Main control block 15 provides control signals. Level shifter 13 increases the decode signals from the lower VDD supply level to the higher CVDD level for each word line. Buffers or drivers 19, which may be inverting or non-inverting as is known in the art, are coupled to drive each of a plurality of row or word lines to the many cells in the array. One example cell, 18, is shown in a detailed view in FIG. 1, and is one "6T" SRAM cell out of many thousands that may form an SRAM array, or subarray. The selection circuit SEL couples the complementary differential bit lines BL and BLB, which are often arranged in columns running through the array, to the read and write block 17. When this selection circuit is used, the array of SRAM cells may share differential sense amplifiers (not shown for simplicity) among many cells, as is known in the art, to save layout space. Each of the many cells 18 is coupled to a pair of local bit lines BL and BLB by transfer gates or access transistors, here shown as T1 and T2, which couple the cells to the bit lines when the respective word line WL is at a high voltage. There is usually a memory cell storing data at each intersection of the bit lines and a word line to form the SRAM array. The cells 18 are supplied with the CVDD voltage, which is higher than the VDD_min voltage supplied to voltage VDD.

6T SRAM cells such as cell 18 include four transistors coupled to form a latch, and two access transistors. The four transistors form a pair of inverting buffers cross coupled so that once a data value is stored in the cell, the action of the inverting buffers tends to reinforce the value. The access transistors can overwrite this stored value to change the value stored in the cell. The cells are arranged in rows and columns, similar to DRAM cells, and of course take more area than a DRAM cell. Unlike a dynamic RAM cell, the SRAM cell does not have to be refreshed, so long as the core VDD supply CVDD is present, the buffers in the cells will continue to reinforce the data and so the storage is called "static" RAM.

Of course it is still volatile storage in the sense that if power is lost to the device, the data state is also lost; however, by combining SRAM storage with off board non-volatile or FLASH storage, systems are now being implemented without the need for DRAM storage at all, eliminating the need for refresh cycles. In some systems, a battery backed up SRAM is used as non-volatile storage, although a permanent store such as FLASH is also sometimes packaged in a single IC package with SRAM to provide storage with the fast access time advantage of the SRAM array with the permanent non-volatile storage of the FLASH memory device.

Figure 2:
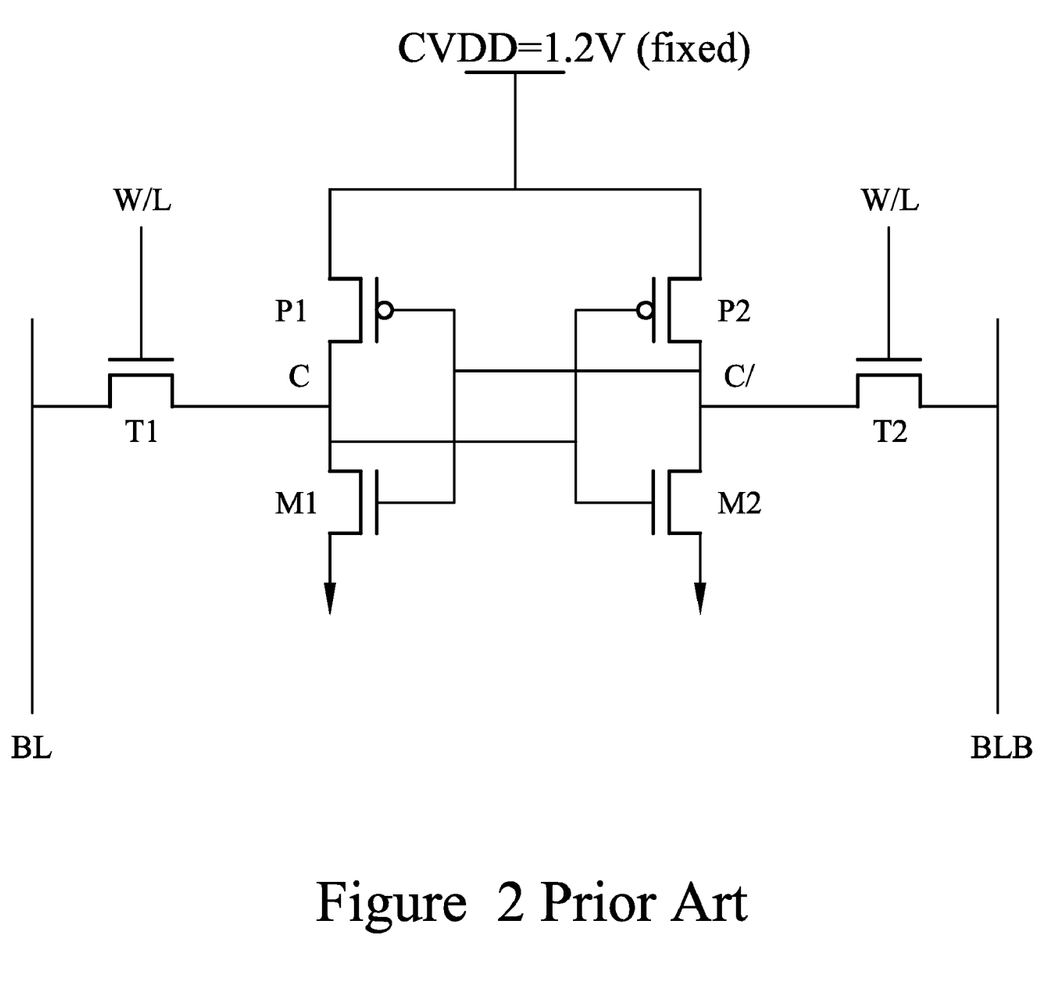
FIG. 2 illustrates in a simplified circuit diagram a prior art SRAM cell.

FIG. 2 depicts in detail the conventional 6T SRAM cell 18. Transistors P1, P2, M1 and M2 are PMOS and NMOS transistors, each pair P1 and M1, P2 and M2 form an inverter and the two inverters are cross coupled to form the latching storage cell, as is conventional. Access transistors T1 and T2 couple the differential bit lines BL and BLB to the stored data node C, and its inverse node C/, in response to a high voltage on the respective word line WL, which is coupled to the gate input of each of these transmission type gates.

Figure 3:
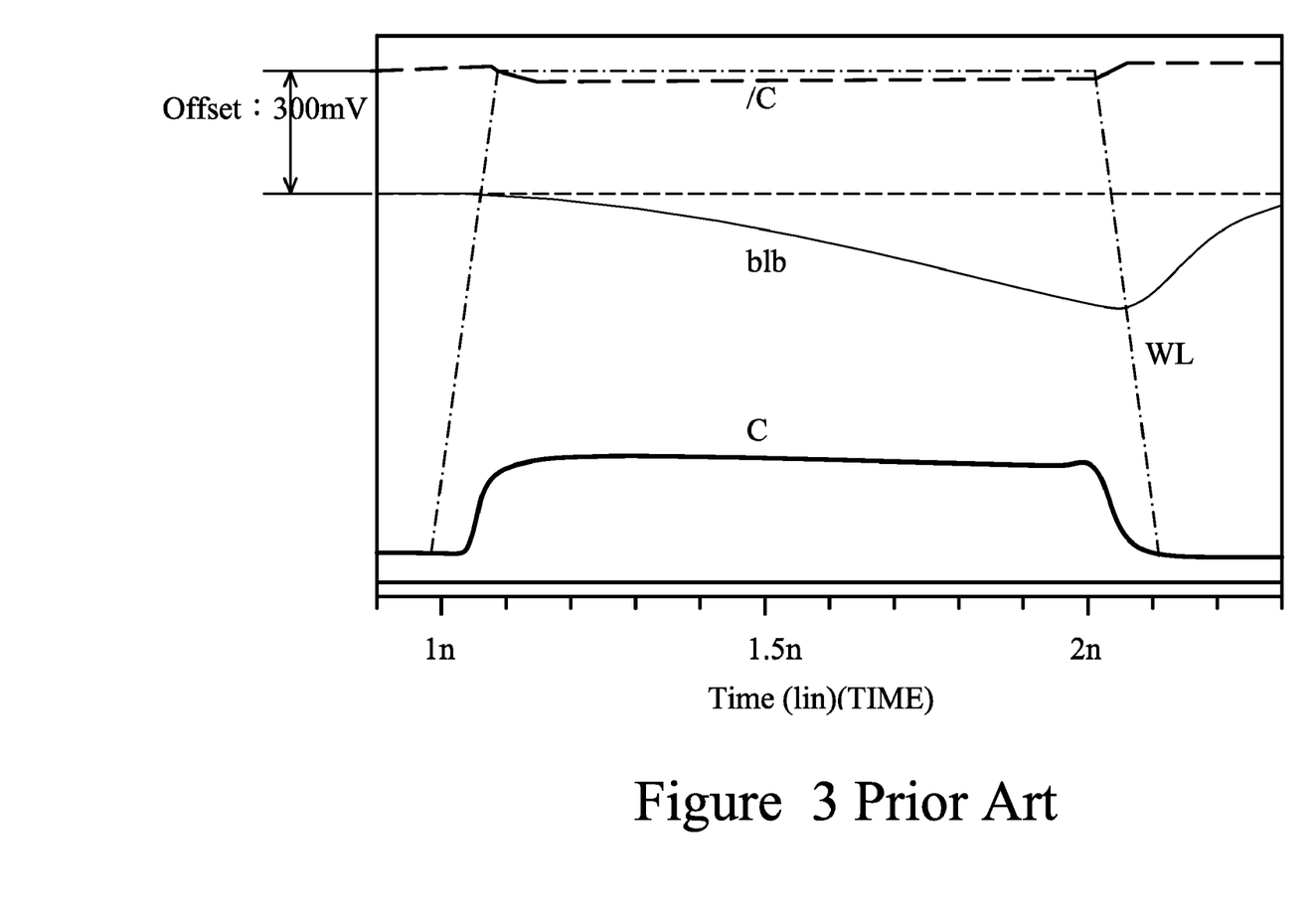
FIG. 3 illustrates in timing diagram a read cycle for the SRAM cell of FIG. 2.

FIG. 3 depicts a typical read cycle for the 6T SRAM cell of FIG. 2. In FIG. 3, the bitlines BL and BLB are first precharged to approximately the VDD voltage. After the precharge, the memory access cycle begins by raising the word-line WL to the CVDD voltage. In this first illustrative example, the CVDD-VDD voltage difference is maintained at around 0.3 V. For a CVDD value of 1.2 Volts, the VDD_min will be kept at about 0.9 Volts or so. Because the C/ line is at a zero level before the read cycle begins, when the access gate T2 couples the two lines together, one bit line is discharged slightly and as can be seen in the timing diagram, the voltages on the bit lines BL and BLB begin to spread apart. The transistors P1, P2, N1 and N2 are sized so that a differential bit line voltage is developed between the two complementary bit lines; this differential voltage may then be sensed and amplified by a differential sense amplifier (not shown) coupled to the pair of bit lines as is known in the memory circuit art, and the read data from the sense amplifier is then output from the SRAM array.

The timing diagram of FIG. 3 shows correct operation for the SRAM cell during a read cycle. In FIG. 3, the storage nodes C and /C maintain their values throughout the timing diagram even though the bit line values change as the circuitry reads the stored data. In FIG. 3, the voltage offset between the CVDD and VDD voltages is kept to a small level, about 0.3 Volts. This means that VDD_min cannot be reduced when CVDD is fixed.

Figure 4:
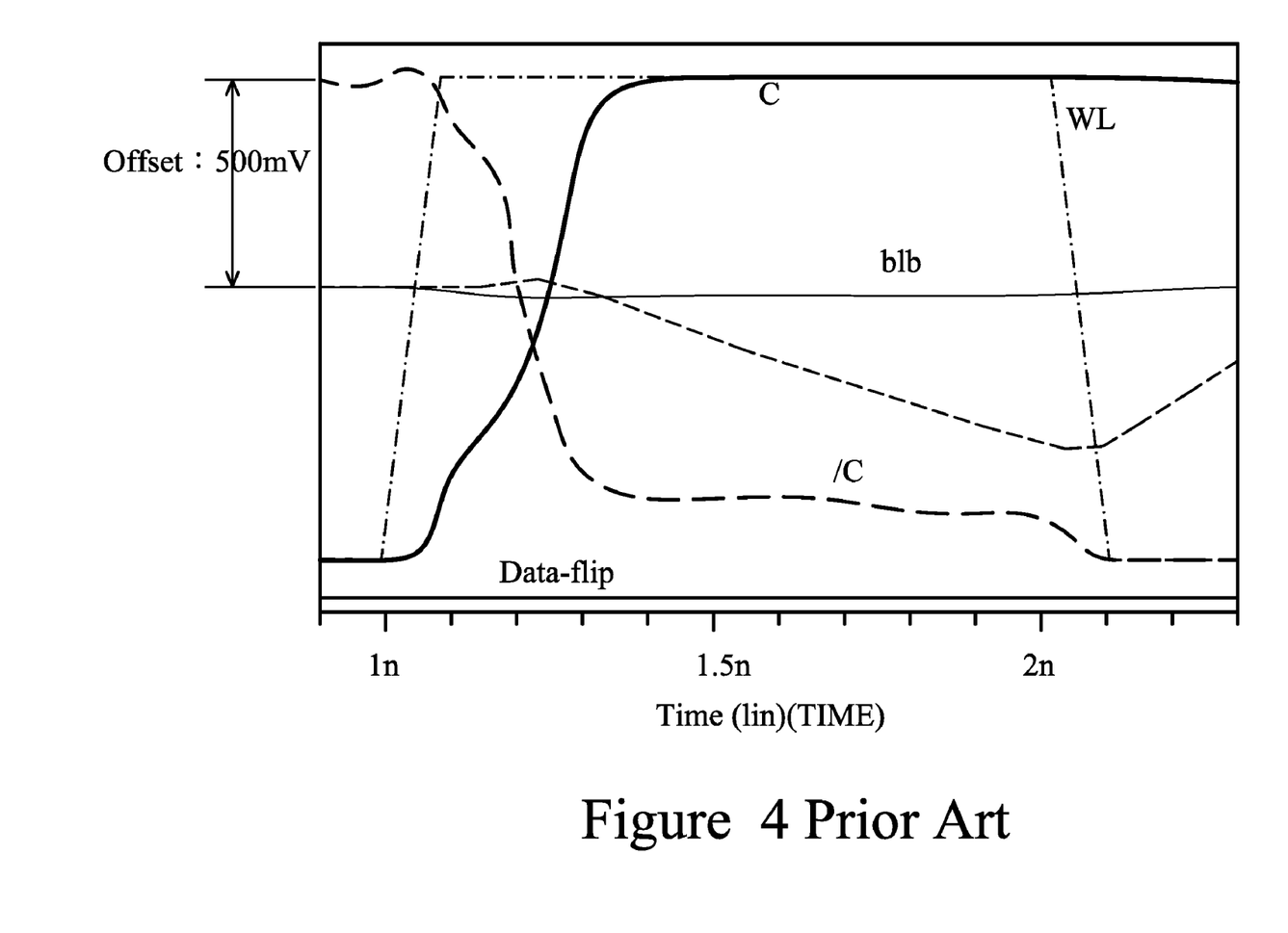
FIG. 4 illustrates in another timing diagram an erroneous read cycle for the SRAM cell of FIG. 3.

In FIG. 4, a timing diagram illustrates an erroneous operation that may happen when the VDD voltage is further reduced below CVDD. In FIG. 4, the bit lines BL and BLB are again recharged to VDD, which is now a lower voltage, the delta voltage between CVDD and VDD in this illustrative example is now about 0.5 Volts. Initially, the storage node labeled C is high and the inverse storage node /C node is low. The word line WL now again goes high to begin the memory read cycle, as before. The word line WL is again raised to CVDD.

However, in this example, the lowered VDD value on the bit lines has a negative impact on operation of the SRAM cell. Instead of maintaining the values at nodes C and C/, the voltages at the storage nodes C and /C "flip". This "bit flip" is caused because the lowered bit line or VDD voltage disturbs the stored value in the cross coupled latch of the SRAM cell. The data is now changed.

A properly operated SRAM array has sufficient static noise margin, or SNM, to prevent data errors during normal operation. In order to maintain proper SNM, most conventional prior art SRAM arrays restrict the VDD voltage or VDD_min to be within a certain voltage delta of CVDD, which is generally fixed at a certain voltage. Thus, if CVDD is maintained at 1.2 Volts, then VDD is kept at about 0.8-0.9 Volts or greater. There is a tension between the desire to lower the value for VDD_min and the need to maintain VDD at a high enough voltage to keep proper SNM for the SRAM array. Some prior art approaches fix both VDD_min and CVDD at a simple single voltage. Each of these known approaches prevents further lowering of VDD_min to an optimal level for power savings. Further, the reuse of scalable designs, as is practiced in typical integrated circuit design approaches today, particularly when using software tools such as circuit compilers, and the continuing trend to smaller minimum feature sizes, suggests that the voltage margin between VDD and CVDD should also be scaled and reduced for smaller semiconductor process technologies. The prior art approaches fail to take advantage of the benefits of scaling during design "shrinks" as is commonly done to improve circuit performance when using more advanced semiconductor processes.

A continuing need thus exists for an improved CVDD and VDD circuitry and methods that provide for robust operation of SRAM arrays, which allow improved VDD_min levels with sufficient static noise margins and that support scalability and design reusability for circuits including SRAM arrays.

SUMMARY OF THE INVENTION

These and other problems are generally solved or circumvented, and technical advantages are generally achieved, by embodiments of the present invention, which provides an adaptive CVDD supply circuit for supplying a CVDD voltage to a SRAM array.

In one exemplary embodiment, circuitry for an SRAM CVDD voltage is provided which includes a bandgap reference generator to supply a pair of fixed reference voltages, a voltage reference generator which outputs a reference voltage that tracks VDD with a determined offset voltage, a voltage follower for supplying a voltage CVDD to the cell array and the word line drivers, the voltage follower and voltage reference generator providing the CVDD voltage that tracks increases in VDD, with an offset voltage, until CVDD reaches a maximum voltage, and then as VDD increases, maintains CVDD at the maximum voltage.

In another exemplary embodiment, the above described circuitry is provided where the voltage reference generator is a voltage divider.

In another exemplary embodiment, the above described circuitry is provided wherein the voltage VDD may be varied. In another exemplary embodiment, the above described circuitry is provided wherein the voltage VDD may range between 0.6 and 1.2 Volts. In another exemplary embodiment, the maximum voltage for the voltage CVDD to the cell array is 1.2 Volts.

In an exemplary method embodiment, a CVDD voltage for an SRAM cell array is provided that tracks a VDD voltage with an offset voltage until the CVDD voltage reaches a maximum voltage. In another exemplary method, the CVDD voltage is provided by following the VDD voltage with an offset voltage until a threshold voltage is exceeded; and then the CVDD voltage is maintained. In another exemplary method embodiment, the above described method is performed wherein the maximum CVDD voltage is 1.2 Volts.

In yet another exemplary embodiment an integrated circuit having an SRAM array is provided where the cells and the word line drivers for the SRAM array are supplied by a voltage CVDD that tracks a VDD voltage with a positive offset voltage until a maximum CVDD voltage is obtained. In yet another exemplary embodiment, the above described integrated circuit is provided wherein the VDD voltage is 0.6 Volts. In yet another exemplary embodiment the above described SRAM array is provided wherein the offset voltage is 0.35 Volts.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed might be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

The drawings, schematics and diagrams are illustrative, not intended to be limiting but are examples of embodiments of the invention, are simplified for explanatory purposes, and are not drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 5:
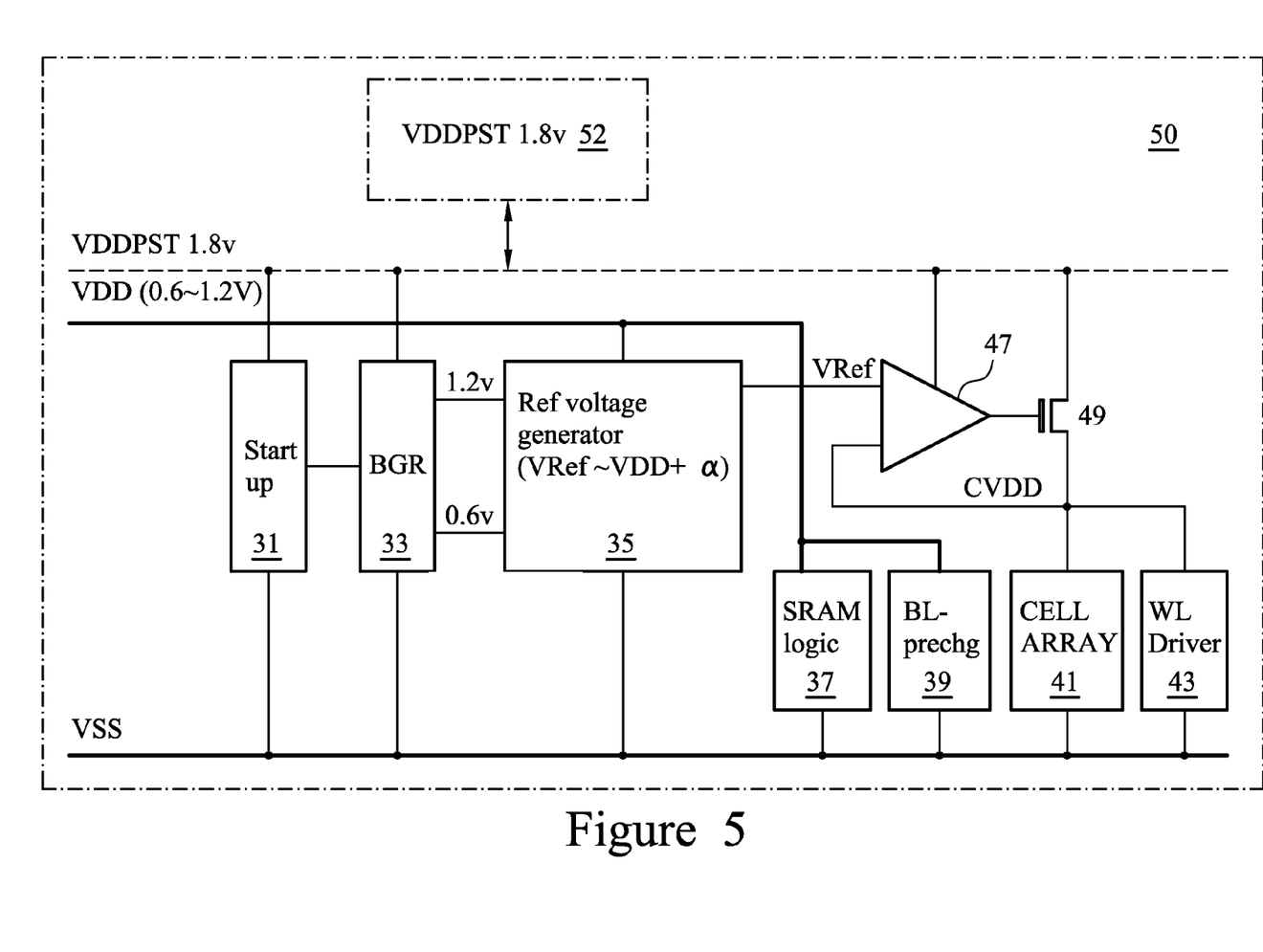
FIG. 5 illustrates in a block diagram an exemplary embodiment of the CVDD circuitry of the present invention.

FIG. 5 depicts in a circuit diagram an exemplary embodiment of a dual rail VDD tracking CVDD circuit for an SRAM array or SRAM circuit 50. In FIG. 5, an external supply voltage VDDPST of 1.8 Volts, for example, is shown. Supply voltage VDD which is used by various logic circuitry, such as SRAM logic 37, is provided as low as possible. In this example, a range from about 0.6 Volts to 1.2 Volts is indicated. Future process nodes may operate at lower VDD voltages. A startup circuit 31 and a band gap reference circuit BGR 33 are shown coupled together to supply two voltages to a reference voltage generator 35. In this exemplary embodiment, these two voltages are 1.2 Volts and 0.6 Volts, although other voltages could be used.

The dashed outline circuit 50 is used in FIG. 5 to indicate that the circuit may be an integrated circuit, or a macro or portion of an integrated circuit such as an embedded SRAM design. Further, the optional processor circuit 52 is dashed to suggest it may or may not be present, or other logic circuitry, such as analog circuitry, radio transceiver circuitry, DSP, RISC, or microcontroller circuitry may be used with the SRAM array to form a system integrated circuit. All of these alternatives form additional exemplary embodiments, are contemplated as part of the invention, and fall within the scope of the appended claims.

Reference voltage generator 35 puts out a voltage VRef that is approximately equal to the voltage of VDD plus an offset voltage $\alpha$. The reference voltage VRef is then output to an operational amplifier 47 which is configured with feedback transistor 49 as a voltage follower outputting voltage CVDD. Voltage CVDD is also fed back into the operational amplifier 47 to complete the voltage follower. A voltage follower will modify the output voltage CVDD to match the input voltage VRef. Thus the voltage CVDD will track the reference voltage VRef, and therefore it is tracking VDD plus the offset voltage $\alpha$.

The CVDD voltage is supplied to the cell array 41, which contains SRAM cells such as, for example, 6T cells like cell 18 shown in FIG. 2 above, and the word line drivers 43. The bit line precharge circuit 39 receives VDD as shown in FIG. 2 above.

Figure 6:
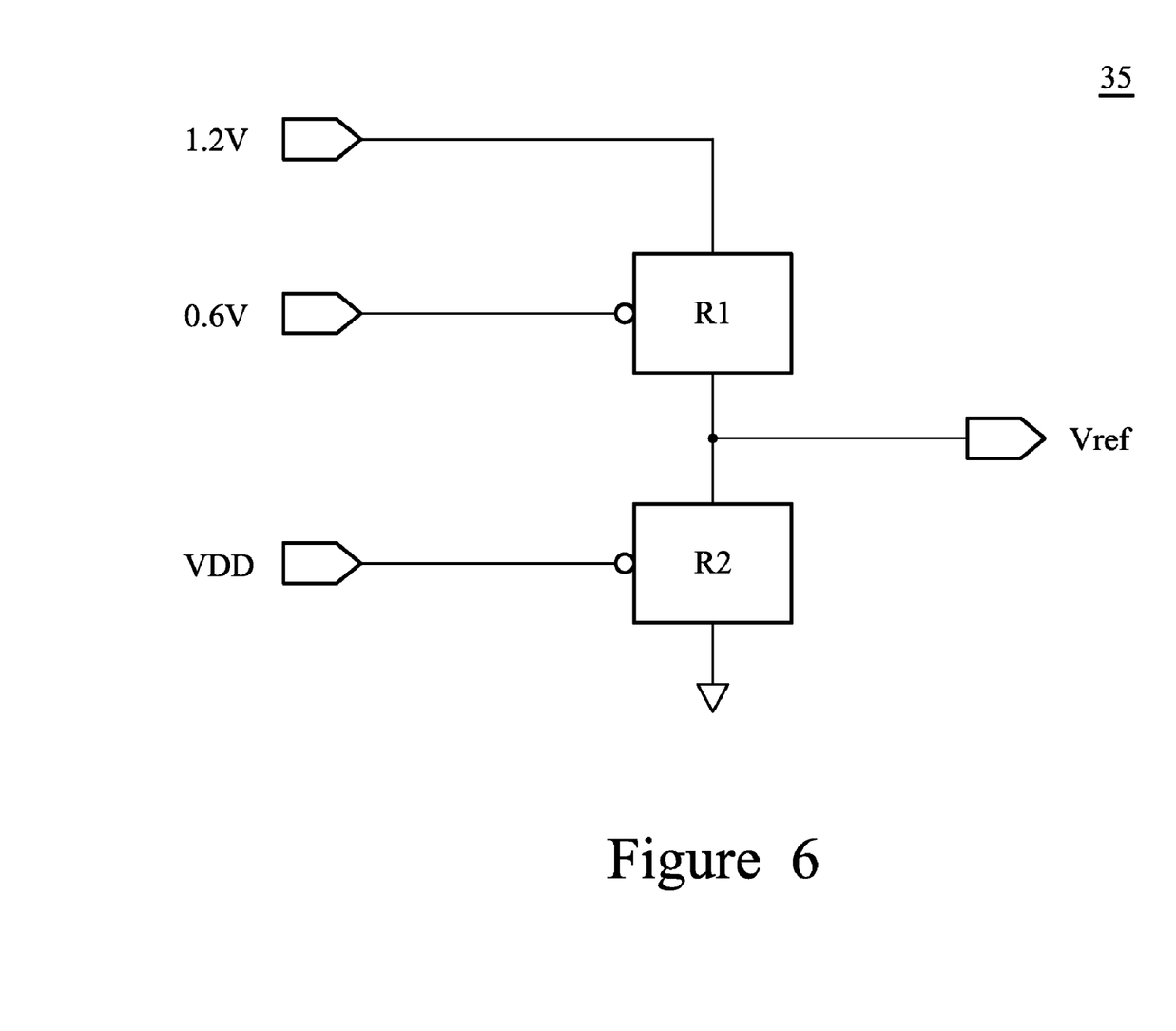
FIG. 6 illustrates in a simple circuit diagram an exemplary voltage reference circuit for the embodiment of FIG. 5.

FIG. 6 depicts one possible circuit implementation for the voltage reference circuit 35. In FIG. 6, a voltage divider is shown having a supply voltage of 1.2 Volts, which corresponds therefore to the maximum output voltage for VRef, a voltage 0.6 Volts and a voltage VDD. The output VRef will track VDD, with an added offset voltage $\alpha$, up to the maximum voltage of 1.2 Volts. Thus, the CVDD output voltage of the voltage follower will track the VDD voltage, up to a maximum, while maintaining an offset over the range of VDD voltages that is less than this maximum. By adjusting the resistor values and the voltages the bandgap reference BGR supplies to the voltage reference circuit 35, the voltage offset $\alpha$ may be easily adjusted for different processes.

Figure 7:
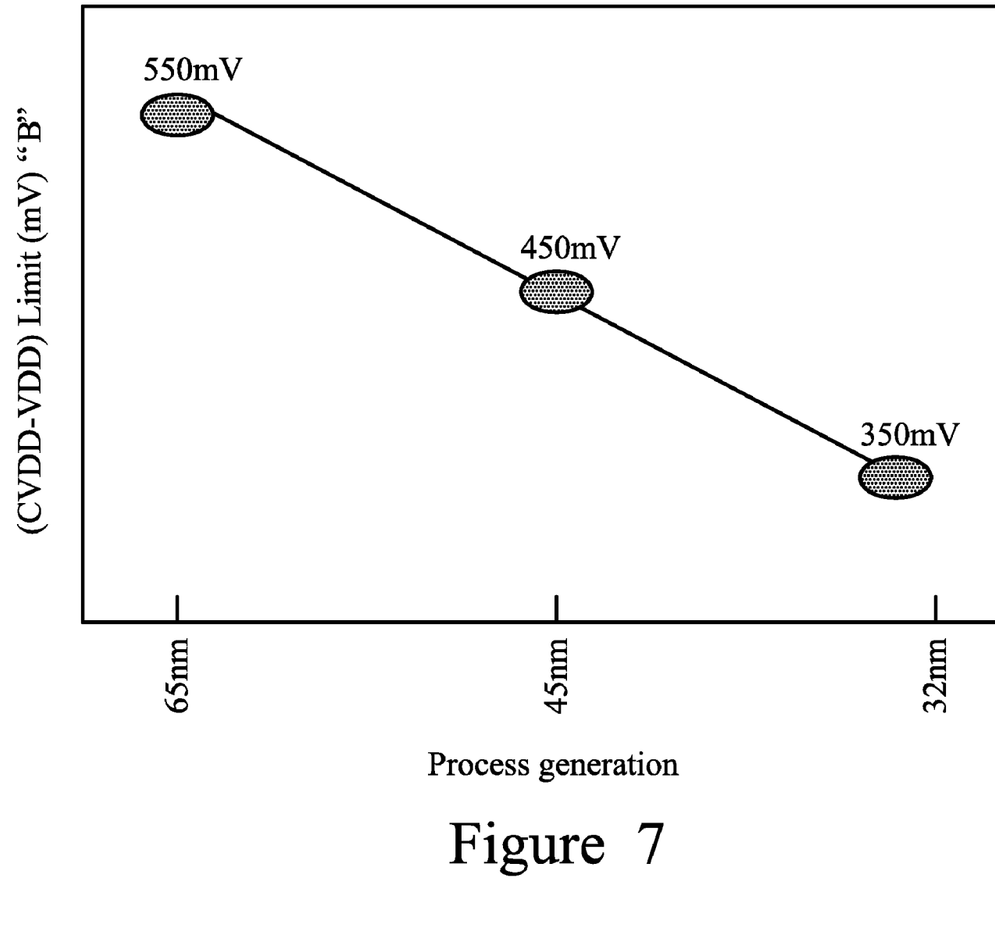
FIG. 7 illustrates in a plot a comparison of simulated and actual CVDD vs. VDD results obtained by the use of embodiments of the invention.

The choice of the voltage offset $\alpha$ is a design choice and may change with process technologies. FIG. 7 illustrates the correspondence of the limit of the offset voltage (the offset must be less than the limit) between CVDD and VDD in millivolts, for current process technologies of 65, 45 and 32 nanometer minimum feature sizes. As can be seen, for larger process technologies a larger offset voltage $\alpha$ can be chosen. As the allowable offset falls with advances in process technology, this further limits the prior art approach of a fixed VDD_min related to a fixed CVDD voltage. For circuits using the prior art approaches, the VDD_min level will have to be maintained at a relatively high voltage, which is undesirable.

In contrast to the prior art approaches, the exemplary embodiments described above allow the CVDD voltage to track the VDD voltage with an appropriate offset voltage. Because the CVDD voltage falls with the VDD voltage, a lower VDD_min voltage may be obtained while maintaining the necessary SNM for proper operation of the SRAM array.

Figure 8:
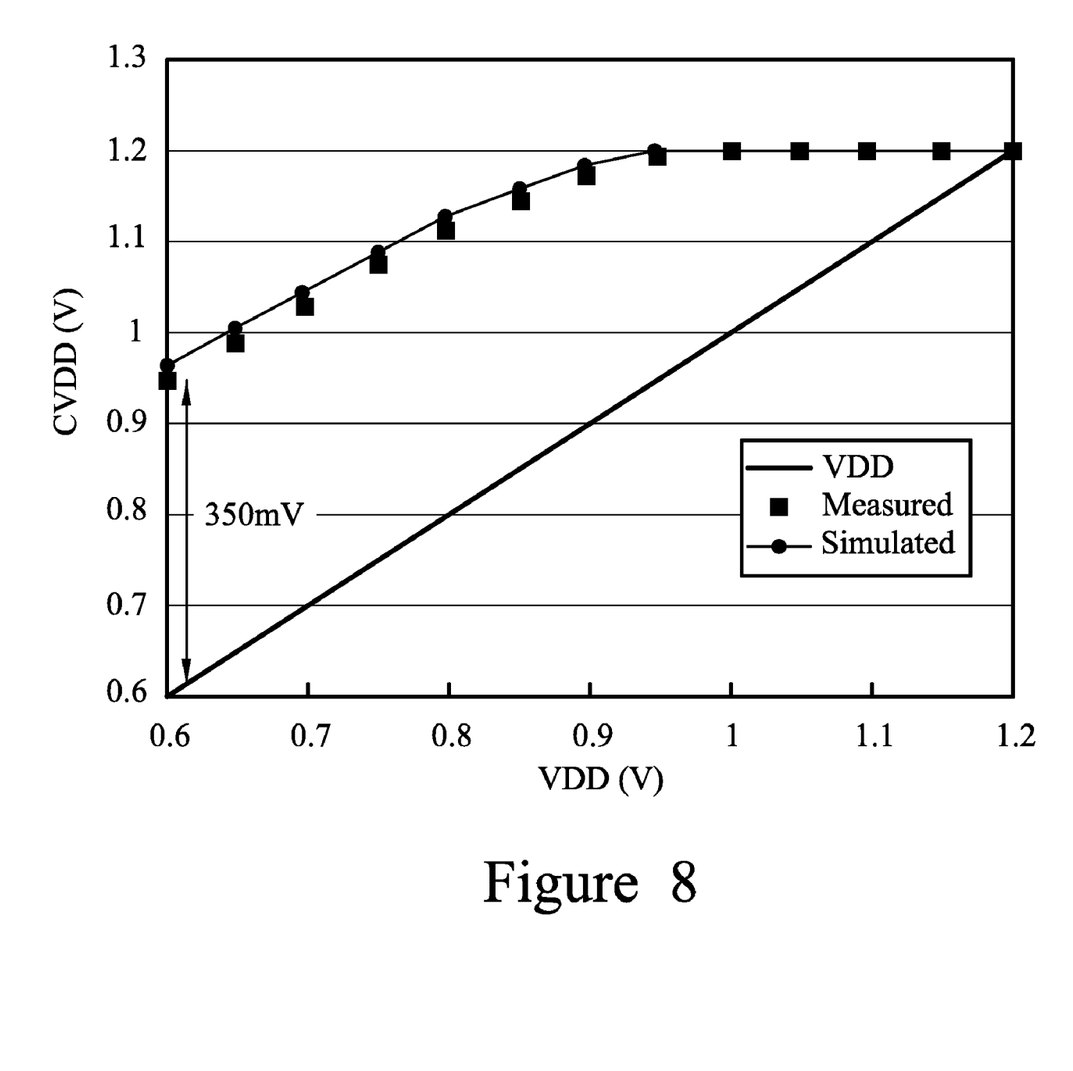
FIG. 8 illustrates in a plot the relationship between CVDD-VDD limit voltage and the semiconductor process technology used.

FIG. 8 depicts both the simulated voltage CVDD and the actual measured voltage CVDD for a variety of VDD voltages using the exemplary circuit embodiments of FIGS. 5 and 6 in a 45 nanometer technology. The value for the offset voltage α was determined to be 350 millivolts from process corner simulations. As VDD increases, the CVDD voltage is maintained at VDD+α volts until CVDD reaches the maximum voltage, here 1.2 Volts, then the CVDD level is maintained as VDD further rises. As can be seen from this plot, the use of the dual rail VDD tracking CVDD circuit allows a VDD_min of 0.64 Volts to be achieved. This VDD is lower than any that may be obtained using the CVDD approaches of the prior art. Further, by changing the offset voltage α, the CVDD supply may be easily scaled to advances in semiconductor processes and the VDD_min may be kept at the desired levels, since the CVDD voltage will track the VDD voltage properly and the SNM of the memory array will be maintained.

Figure 9:
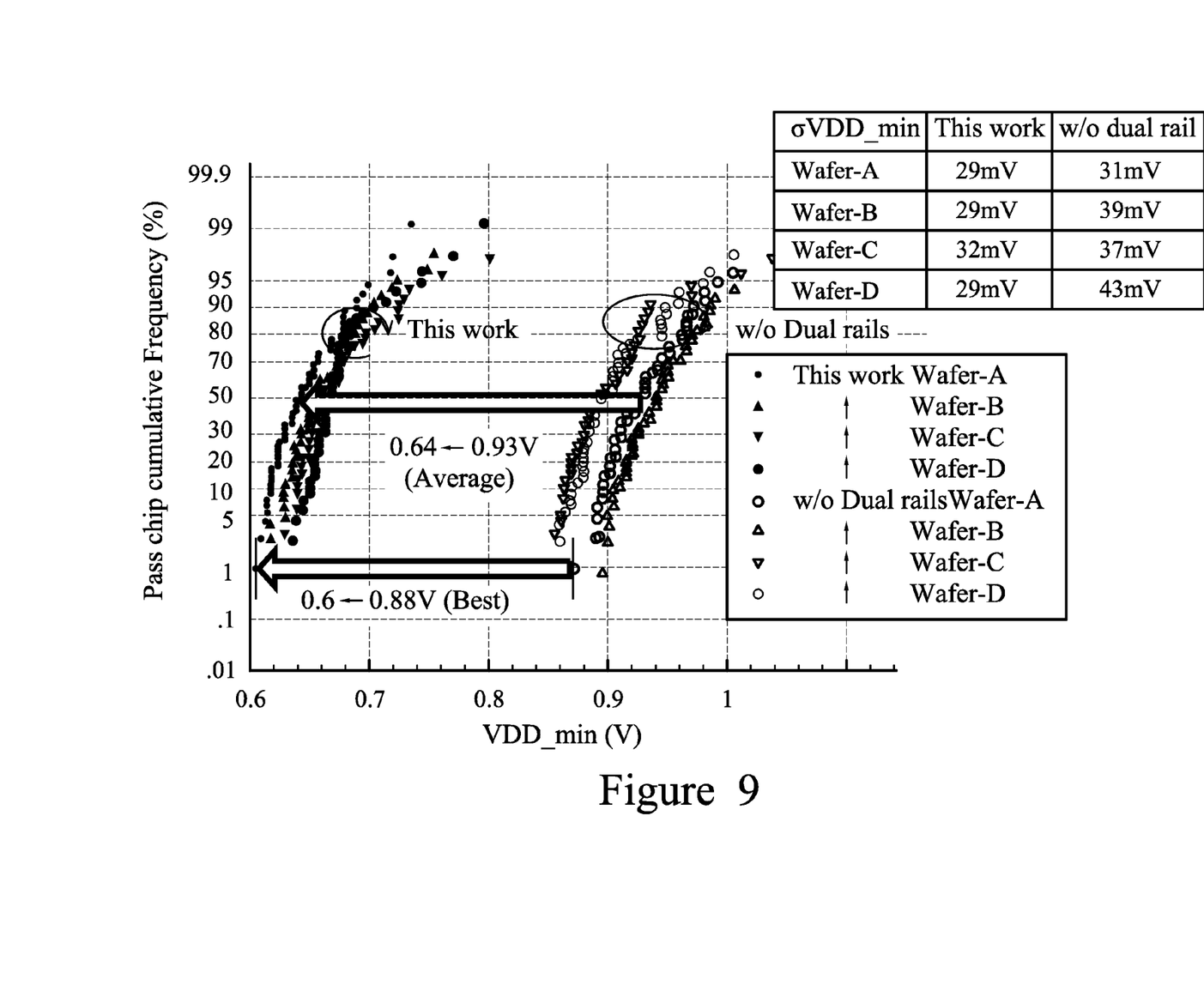
FIG. 9 illustrates a comparison plot of results obtained using four test wafers having both SRAM arrays with a conventional single rail CVDD and VDD system as compared to the advantageous results measured for SRAM arrays disposed on the same four test wafers using embodiments of the invention.

FIG. 9 illustrates an objective measure of the benefits obtained using the embodiments of FIGS. 5 and 6 in actual circuits fabricated on four test wafers in 45 nanometer technology processing. As illustrated in FIG. 9, the four test wafers A, B, C and D were each fabricated with a plurality of SRAM arrays having the embodiments of the invention and with prior art CVDD circuits with a fixed VDD_min of around 0.93 Volts. The VDD_min obtained using the embodiments of the present invention was reduced to as low as 0.64 Volts. Further, the standard deviation for VDD_min obtained for the exemplary embodiments of the present invention was about 29 millivolts. In contrast, the prior art approach obtained a VDD_min of 0.93 Volts on average and the standard deviation on VDD_min was as large as 43 millivolts on one wafer. Thus, the embodiments of the present invention provide significant advantages in operation, as well as providing advantages in scaling and future reuse of the SRAM circuitry, while maintaining excellent VDD_min voltages and reduced deviation in actual devices.

Embodiments of the present invention include an adaptive CVDD supply circuit for providing a CVDD voltage to an SRAM array with a determined offset voltage above a VDD voltage that tracks the VDD voltage while maintaining proper voltages for robust SRAM performance and SNM. The embodiments may be applied in a stand alone SRAM circuit or array, an SRAM integrated circuit, or more likely, used as part of an embedded SRAM design or SRAM compiler design. Because the CVDD voltage tracks the VDD voltage, an enhanced VDD_min may be obtained over other known approaches. The offset voltage may be easily adjusted to track advances in semiconductor processing and to make scaling of completed designs easy to perform without the need for rework.

Although the present invention and its advantages have been described in detail, it should be understood that various changes, substitutions and alterations can be made herein without departing from the spirit and scope of the invention as defined by the appended claims. For example, it will be readily understood by those skilled in the art that the methods may be varied while remaining within the scope of the present invention.

Moreover, the scope of the present application is not intended to be limited to the particular embodiments of the methods and steps described in the specification. As one of ordinary skill in the art will readily appreciate from the disclosure of the present invention, processes, or steps, presently existing or later to be developed, that perform substantially the same function or achieve substantially the same result as the corresponding embodiments described herein may be utilized according to the present invention. Accordingly, the appended claims are intended to include within their scope such processes or steps.

What is claimed is:

1. A method for providing a core voltage supply for a memory cell array, comprising:
    receiving a VDD supply voltage;
    determining an offset voltage which is the minimum difference between the VDD supply voltage and the core supply voltage;
    determining a maximum core supply voltage level;
    generating a reference voltage equal to the sum of the offset voltage and the VD supply voltage; and
    outputting the core supply voltage which tracks the reference voltage when the core supply voltage obtained is less than the maximum core supply voltage, and which equals the maximum core supply voltage level otherwise.

2. The method of claim 1, wherein the VDD supply voltage is less than the core supply voltage.

3. The method of claim 1 wherein the memory cell array comprises static RAM cells.

4. The method of claim 3 and further coupling the core supply voltage to the array of static RAM cells.

5. The method of claim 4 and driving the word lines of the static RAM cells with the core supply voltage.

6. The method of claim 5 and further coupling the VDD supply voltage to precharge the bit lines of the static RAM cells.

7. The method of claim 6 wherein the VDD supply voltage is reduced to the minimum VDD voltage.

8. The method of claim 1 wherein generating the reference voltage comprises supplying a voltage divider with a supply voltage corresponding to the maximum core supply voltage level and supplying the voltage divider with the VDD supply, the voltage divider outputting a reference voltage equal to the VDD supply plus the offset voltage up to the maximum supply voltage.

9. The method of claim 1 wherein outputting the core supply voltage further comprises coupling the reference voltage to a voltage follower with the core supply voltage as its output.

10. The method of claim 1 wherein generating the reference voltage further comprises coupling the voltage divider to a bandgap voltage reference.

11. An SRAM array having a core supply voltage that tracks a VDD supply voltage, comprising:
    an array of SRAM cells supplied by the core supply voltage arranged in rows and columns;
    a plurality of word lines corresponding to the rows and having drivers supplied by the core supply voltage;
    a plurality of bit lines corresponding to the columns and having precharge circuitry supplied by the VDD supply voltage;
    a voltage generator circuit for generating the core supply voltage responsive to a reference voltage; and
    a reference voltage generator for generating the reference voltage and receiving the VDD supply voltage and being supplied by a voltage corresponding to a maximum core supply voltage;
    wherein the core supply voltage will track the reference voltage which equals the VDD supply voltage plus a predetermined offset voltage until the core supply voltage level meets the maximum core supply voltage.

12. The SRAM array of claim 11 wherein the voltage generator circuit comprises a voltage follower circuit having the reference voltage as an input and outputting the core supply voltage.

13. The SRAM array of claim 11 wherein the SRAM cells are 6T cells.

14. The SRAM array of claim 11 wherein the voltage reference generator is a voltage divider circuit that outputs a voltage that is the lower of the VDD supply voltage increased by the predetermined offset voltage, and the maximum core supply voltage.

15. The SRAM array of claim 11 wherein the VDD supply voltage is lowered to a minimum VDD voltage.

16. The SRAM array of claim 11 wherein the predetermined offset voltage is determined based on a semiconductor process node parameter.

17. The SRAM array of claim 11 and further comprising a bandgap reference circuit coupled to the voltage reference generator circuit and providing the maximum core supply voltage.

18. The SRAM array of claim 11 wherein the voltage offset is less than 0.5 Volts.

19. The SRAM array of claim 11 wherein the voltage offset is less than 0.4 Volts.

20. The SRAM array of claim 11 wherein the maximum core supply voltage is approximately 1.2 Volts.

21. An integrated circuit comprising:
  logic circuitry supplied by a VDD supply voltage; and
  an SRAM array coupled to the logic circuitry having a core supply voltage greater than the VDD supply voltage, comprising:
    an array of SRAM cells supplied by the core supply voltage arranged in rows and columns;
    a plurality of word lines corresponding to the rows and having drivers supplied by the core supply voltage;
    a plurality of bit lines corresponding to the columns and having precharge circuitry supplied by the VDD supply voltage;
    a voltage generator circuit for generating the core supply voltage responsive to a reference voltage; and
    a reference voltage generator for generating the reference voltage and receiving the VDD supply voltage and being supplied by a voltage corresponding to a maximum core supply voltage;
    wherein the core supply voltage will track the reference voltage which equals the VDD supply voltage plus a predetermined offset voltage until the core supply voltage level meets the maximum core supply voltage.

22. The integrated circuit of claim 21 wherein the voltage generator circuit comprises a voltage follower circuit having the reference voltage as an input and outputting the core supply voltage.

23. The integrated circuit of claim 21 wherein the SRAM cells are 6T cells.

24. The integrated circuit of claim 21 wherein the voltage reference generator is a voltage divider circuit that outputs a voltage that is the lower of the VDD supply voltage increased by the predetermined offset voltage, and the maximum core supply voltage.

25. The integrated circuit of claim 21 wherein the VDD supply voltage is lowered to a minimum VDD voltage.

26. The integrated circuit of claim 21 wherein the predetermined offset voltage is determined based on a semiconductor process node parameter.

27. The integrated circuit of claim 21 and further comprising a bandgap reference circuit coupled to the voltage reference generator circuit and providing the maximum core supply voltage.

28. The integrated circuit of claim 21 wherein the voltage offset is less than 0.5 Volts.

29. The integrated circuit of claim 21 wherein the logic circuitry further comprises a processor.

30. The integrated circuit of claim 29 wherein the processor is a digital signal processor.

* * * * *